United States Patent
Jang et al.

(10) Patent No.: US 9,565,720 B2
(45) Date of Patent: Feb. 7, 2017

(54) FLEXIBLE DISPLAY APPARATUS AND METHOD OF CONTROLLING FLEXIBILITY OF THE SAME

(71) Applicant: Samsung Display Co., Ltd., Yongin, Gyeonggi-Do (KR)

(72) Inventors: Cheol Jang, Yongin (KR); Seung-Yong Song, Yongin (KR); Sang-Hwan Cho, Yongin (KR); Seung-Hun Kim, Yongin (KR); Chung-Sock Choi, Yongin (KR); Hyun-Ho Kim, Yongin (KR); Soo-Youn Kim, Yongin (KR); Sang-Hyun Park, Yongin (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 540 days.

(21) Appl. No.: 14/062,158

(22) Filed: Oct. 24, 2013

(65) Prior Publication Data
US 2014/0361004 A1    Dec. 11, 2014

(30) Foreign Application Priority Data
Jun. 7, 2013 (KR) .......................... 10-2013-0065472

(51) Int. Cl.
| H05B 1/02 | (2006.01) |
| H05K 1/02 | (2006.01) |
| H05B 3/34 | (2006.01) |
| H01L 27/32 | (2006.01) |

(52) U.S. Cl.
CPC ......... *H05B 1/0294* (2013.01); *H01L 27/3225* (2013.01); *H05B 3/34* (2013.01); *H05K 1/028* (2013.01); *H01L 27/3244* (2013.01); *H01L 2251/5338* (2013.01); *H05K 1/0212* (2013.01); *H05K 2201/10128* (2013.01); *H05K 2203/1115* (2013.01)

(58) Field of Classification Search
None
See application file for complete search history.

(56) References Cited

U.S. PATENT DOCUMENTS

| 6,771,021 B2 | 8/2004 | Cok | |
| 2012/0228617 A1 | 9/2012 | Ko et al. | |
| 2013/0127690 A1* | 5/2013 | Tsai | G09F 9/301 345/55 |
| 2015/0282304 A1* | 10/2015 | Ely | H05K 1/0281 361/750 |

FOREIGN PATENT DOCUMENTS

| JP | 11-109880 A | 4/1999 |
| KR | 1020120054391 A | 5/2012 |
| KR | 1020120103388 A | 9/2012 |

* cited by examiner

*Primary Examiner* — Ashok Patel
(74) *Attorney, Agent, or Firm* — Cantor Colburn LLP

(57) ABSTRACT

A flexible display apparatus includes a flexible substrate; a display layer on the flexible substrate and including a plurality of pixels; a cover layer which covers the display layer; a heating electrode layer on a surface of the flexible substrate opposite to the display layer, between the flexible substrate and the display layer, between the display layer and the cover layer, or on a surface of the cover layer opposite to the display layer; and a temperature sensing unit configured to sense an external temperature to the flexible display apparatus.

15 Claims, 4 Drawing Sheets

FLEXIBLE DISPLAY APPARATUS AND METHOD OF CONTROLLING FLEXIBILITY OF THE SAME

This application claims priority to Korean Patent Application No. 10-2013-0065472, filed on Jun. 7, 2013, and all the benefits accruing therefrom under 35 U.S.C. §119, the disclosure of which is incorporated herein in its entirety by reference.

BACKGROUND

1. Field

The invention relates to a flexible display apparatus and a method of controlling flexibility of the same, and more particularly, to a flexible display apparatus of which a flexible characteristic thereof does not decrease under various environments, and a method of controlling flexibility of the flexible display apparatus.

2. Description of the Related Art

As interest in a flexible display apparatus increases, research into the flexible display apparatus has been actively conducted. In order to realize the flexible display apparatus, a flexible substrate including a material such as a resin is used, instead of a glass substrate of the related art.

However, the flexible display apparatus including a material such as a resin has a problem that a flexible characteristic thereof is deteriorated according to the surrounding environment.

SUMMARY

One or more exemplary embodiment of the invention provides a flexible display apparatus of which a flexible characteristic thereof does not decrease under various environmental conditions, and a method of controlling flexibility of the flexible display apparatus.

According to an exemplary embodiment of the invention, there is provided a flexible display apparatus including: a flexible substrate; a display layer on the flexible substrate and including a plurality of pixels; a cover layer which covers the display layer; a heating electrode layer on a surface of the flexible substrate opposite to the display layer, between the flexible substrate and the display layer, between the display layer and the cover layer, or on a surface of the cover layer opposite to the display layer; and a temperature sensing unit configured to sense an external temperature to the flexible display apparatus.

The flexible display apparatus may further include a control unit configured to control the heating electrode layer to generate heat when the external temperature sensed by the temperature sensing unit is lower than a predetermined temperature.

The cover layer may be a protection layer, a polarizing layer, a touch screen layer or a combination thereof.

The flexible display apparatus may further include a functional layer between the display layer and the cover layer, and the heating electrode layer may be between the functional layer and the cover layer.

The heating electrode layer may correspond to an entirety of the surface of the flexible substrate.

The flexible substrate may be configured to be bent in a predetermined portion thereof, and the heating electrode layer may correspond to the predetermined portion of the flexible substrate.

The display layer may include a plurality of pixel electrodes corresponding to the plurality of pixels, a pixel defining layer which overlaps the plurality of pixel electrodes and exposes a center portion of each of the plurality of pixel electrodes, a counter electrode corresponding to the plurality of pixel electrodes, and an intermediate layer between the plurality of pixel electrodes and the counter electrode and including an emission layer.

The heating electrode layer may correspond to substantially an entirety of the surface of the flexible substrate, and openings corresponding to the plurality of pixel electrodes may be defined in the heating electrode layer. Alternatively, the heating electrode layer may correspond to substantially an entirety of the surface of the flexible substrate, and may have a shape corresponding to the pixel defining layer in a plan view.

The heating electrode layer may correspond to substantially an entirety of the surface of the flexible substrate, and openings corresponding to the plurality of pixels may be defined in the heating electrode layer.

The heating electrode layer may correspond to an entirety of the surface of the flexible substrate, and may include a conductive translucent material.

The heating electrode layer may include a heating electrode having a zigzag pattern.

According to another exemplary embodiment of the invention, there is provided a method of controlling flexibility of a flexible display apparatus, the method including: sensing an external temperature to the flexible display apparatus by a temperature sensing unit of the flexible display apparatus, comparing the external temperature and a predetermined temperature with each other; and applying an electrical current to a heating electrode of a heating electrode layer of the flexible display apparatus, when the external temperature is lower than the predetermined temperature.

The external temperature and the predetermined temperature may be compared with each other while the electrical current is applied to the heating electrode of the heating electrode layer. The method may further include stopping the applying the electrical current to the heating electrode of the heating electrode layer when the external temperature is determined to be higher than the predetermined temperature by the comparing the external temperature and the predetermined temperature with each other while the electrical current is applied to the heating electrode of the heating electrode layer.

BRIEF DESCRIPTION OF THE DRAWINGS

The above and other features and advantages of the invention will become more apparent by describing in detail exemplary embodiments thereof with reference to the attached drawings in which.

DETAILED DESCRIPTION

Figure 1:
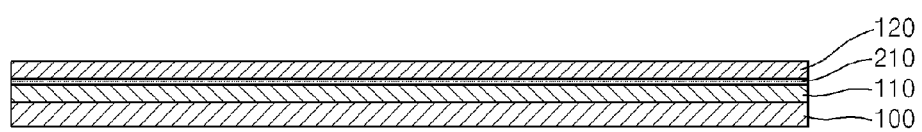
FIG. 1 is a schematic cross-sectional view of an exemplary embodiment of a flexible display apparatus according to the invention.

The invention will now be described more fully with reference to the accompanying drawings, in which exemplary embodiments of the invention are shown. The invention may, however, be embodied in many different forms, and should not be construed as being limited to the embodiments set forth herein; rather, these embodiments are provided so that this disclosure will be thorough and complete, and will fully convey the concept of the invention to one of ordinary skill in the art. In the drawings, the thicknesses of layers and regions are exaggerated for clarity.

Throughout the specification, it will also be understood that when an element such as layer, region or substrate is referred to as being "on" another element, it can be directly on the other element, or intervening elements are not present. As used herein, connected may refer to elements being physically and/or electrically connected to each other. Like numbers refer to like elements throughout. As used herein, the term "and/or" includes any and all combinations of one or more of the associated listed items.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the invention.

Expressions such as "at least one of," when preceding a list of elements, modify the entire list of elements and do not modify the individual elements of the list.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

All methods described herein can be performed in a suitable order unless otherwise indicated herein or otherwise clearly contradicted by context. The use of any and all examples, or exemplary language (e.g., "such as"), is intended merely to better illustrate the invention and does not pose a limitation on the scope of the invention unless otherwise claimed. No language in the specification should be construed as indicating any non-claimed element as essential to the practice of the invention as used herein.

Hereinafter, the invention will be described in detail with reference to the accompanying drawings.

FIG. 1 is a schematic cross-sectional view of an exemplary embodiment of a flexible display apparatus according to the invention.

The flexible display apparatus includes a flexible substrate 100, a display layer 110, a cover layer 120, a heating electrode layer 210 and a temperature sensing unit (not shown).

The flexible substrate 100 having a flexible characteristic may include various materials, for example, a metal material or a plastic material such as polyethylene terephthalate ("PET"), polyethylene naphthalate ("PEN") polyimide or a combination thereof.

The display layer 110 is disposed on the flexible substrate 100 and includes a plurality of pixels. In one exemplary embodiment, for example, the display layer 110 may be an organic light-emitting display layer including a plurality of thin film transistors, and a plurality of pixel electrodes that are connected to the thin film transistors. Alternatively, the display layer 110 may be a liquid crystal display layer.

The cover layer 120 may cover the display layer 110. In one exemplary embodiment, for example, the cover layer 120 may be a protection layer for protecting the display layer 110, a polarizing layer for polarizing light that is incident on the display layer 110 and is emitted from the display layer 110, and/or a touch screen layer for performing a touch function of the flexible display apparatus. Alternatively, the cover layer 120 may be a layer that simply covers the display layer 110. When the cover layer 120 simply covers the display layer 110, the cover layer 120 may include, for example, a material that is the same as or similar to that of the flexible substrate 100.

The heating electrode layer 210 may be interposed between the display layer 110 and the cover layer 120. The heating electrode layer 210 includes a conductive material so as to allow a current to flow therethrough, and may generate heat due to electrical resistance when the current flows therethrough.

The heating electrode layer 210 may include, for example, a heating electrode including a conductive material. The heating electrode may be an electrode including Al, Ag, Mg, Cr, Ti, Ni, Au, Ta, Cu, Ca, Co, Fe, Mo, W, Pt, Yb, an alloy thereof or a combination thereof. Alternatively, the heating electrode may be an electrode including a translucent material including indium tin oxide ("ITO"), zinc oxide ("ZnO"), $SnO_2$, $TiO_2$, aluminum zinc oxide ("AZO"), gallium zinc oxide ("GZO"), $WO_3$ or the like. However, the invention is not limited thereto, and the heating electrode may also include a conductive high molecular material such as polyacetylene, polypyrrole, polyaniline, polyphenylene, or poly (3,4-ethylenedioxythiophene) ("PEDOT").

The heating electrode of the heating electrode layer 210 may have a shape in which the length thereof is longer than the width thereof, like a wiring line, or may have a shape of a cylinder such as a counter electrode that is integral in a display region of an organic light-emitting display apparatus.

The temperature sensing unit (not shown) may sense a temperature of a surrounding environment where the flexible display apparatus is located or used, that is, an external temperature. The temperature sensing unit may be located in any place in which the external temperature may be measured. The temperature sensing unit may be located, for example, within a bezel (not shown) that surrounds an end surface of the flexible display apparatus, or may be located within a groove that is defined on the outer side of a display region of the flexible substrate 100.

The flexible display apparatus includes various components. Thus, the components have a flexible characteristic. However, where the components are exposed to a relatively low temperature in spite of having a sufficient flexible characteristic at room temperature, the components may have an insufficient flexible characteristic. This may be because the flexible characteristic of the components becomes insufficient at a relatively low temperature, or because a flexible characteristic of an adhesive used for adhering components to other components or elements is rapidly deteriorated at a relatively low temperature.

However, the exemplary embodiment of the flexible display apparatus according to the invention includes the heating electrode layer 210. Thus, where a relatively low external temperature such as from an external environment deteriorates the flexible characteristic of the flexible display apparatus and components thereof, the heating electrode layer 210 generates heat so as to provide a temperature in which the flexible characteristic of each component of the flexible display apparatus is sufficiently maintained, thereby allowing the overall flexible characteristic of the flexible display apparatus to be secured irrespective of an external environment. To provide a temperature in which the flexible characteristic of each component of the flexible display apparatus is sufficiently maintained, when the external temperature sensed by the temperature sensing unit is lower than a predetermined temperature, the flexible display apparatus may further include a control unit (not shown) that controls the heating electrode layer 210 to generate heat.

Although FIG. 1 illustrates the heating electrode layer 210 interposed between the display layer 110 and the cover layer 120, the invention is not limited thereto. In FIG. 1, the heating electrode layer 210 is on a second surface of the flexible substrate 100 and the cover layer 120, where each second surface respectively faces the display layer 110.

In an alternative exemplary embodiment, the heating electrode layer 210 may be located on a first surface of the flexible substrate 100 opposite to the second surface of the flexible substrate 100. That is, the heating electrode layer 210 on the first surface is disposed opposite to the display layer 110 with respect to the flexible substrate 100. In another alternative exemplary embodiment, the heating electrode layer 210 may be located on a first surface of the cover layer 120 opposite to the second surface of the cover layer 120. That is, the heating electrode layer 210 is disposed opposite to display layer 110 with respect to the cover layer 120. That is, the heating electrode layer 210 may be located between various components of the flexible display apparatus, or may be located at an outermost side of the flexible display apparatus.

Figure 2:
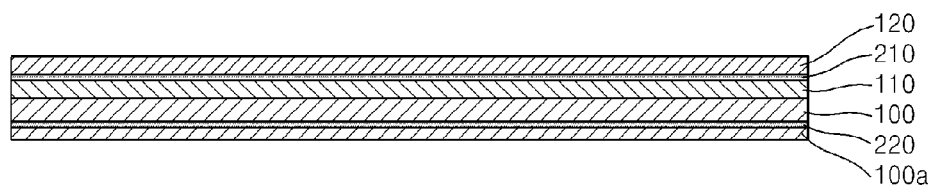
FIG. 2 is a schematic cross-sectional view of an alternative exemplary embodiment of a flexible display apparatus according to the invention.

The flexible display apparatus may not necessarily include only one heating electrode layer 210. In an alternative exemplary embodiment, for example, as illustrated in FIG. 2, a flexible display apparatus according to the invention may be configured in such a way that a second heating electrode layer 220 is located on a surface of the flexible substrate 100 disposed further from the display layer 110, in addition to a first heating electrode layer 210 interposed between the display layer 110 and the cover layer 120. A protection layer 100a, such as a protection film, for protecting the second heating electrode layer 220 on the flexible substrate 100 may be disposed so as to cover the second heating electrode layer 220. In this manner, the first and second heating electrode layers 210 and 220 are located adjacent to components which are most influenced by the external temperature, thereby allowing an excellent flexible characteristic of the flexible display apparatus to be secured.

Referring to the description regarding the flexible display apparatus according to the exemplary embodiment described with reference to FIG. 1, FIG. 2 illustrates the first heating electrode layer 210 interposed between the display layer 110 and the cover layer 120. However, in an alternatively exemplary embodiment, the first heating electrode layer 210 may be disposed so as to not contact the display layer 110.

Figure 3:
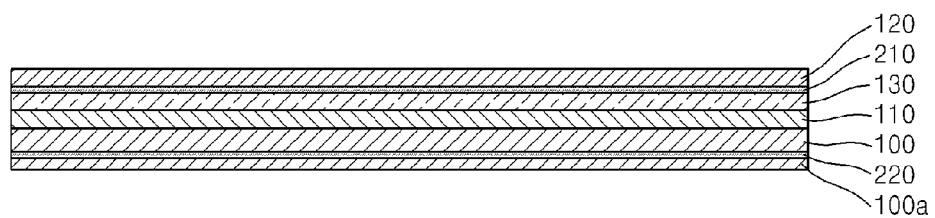
FIG. 3 is a schematic cross-sectional view of another alternative exemplary embodiment of a flexible display apparatus according to the invention.

In another alternative exemplary embodiment, for example, as illustrated in FIG. 3, a flexible display apparatus according to the invention may further include a functional layer 130 that is interposed between the display layer 110 and the cover layer 120, and the first heating electrode layer 210 may be disposed between the functional layer 130 and the cover layer 120 (so as to be separated from the display layer 110). The functional layer 130 may be, for example, a protection layer for protecting the display layer 110, a polarizing layer for polarizing light that is incident on the display layer 110 and is emitted from the display layer 110, and/or a touch screen layer for performing a touch function of the flexible display apparatus.

Figure 4:
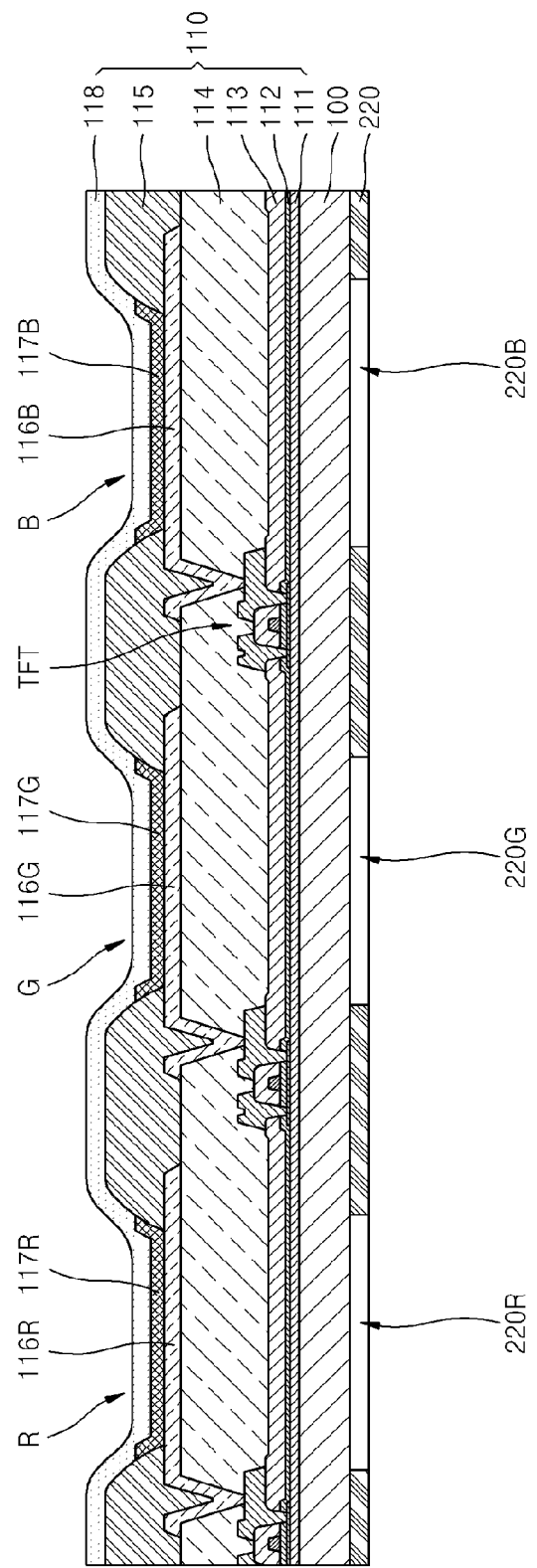
FIG. 4 is a schematic cross-sectional view of another exemplary embodiment of a flexible display apparatus according to the invention.

FIG. 4 is a schematic cross-sectional view of another exemplary embodiment of a flexible display apparatus according to the invention. Specifically, FIG. 4 illustrates a flexible organic light-emitting display apparatus in which the display layer 110 includes organic light-emitting devices. In particular, FIG. 4 illustrates a bottom emission type flexible organic light-emitting display apparatus in which light emitted from the organic light-emitting devices is emitted to the outside through the flexible substrate 100.

As illustrated in FIG. 4, in the flexible organic light-emitting display apparatus, a thin film transistor TFT may be disposed on the flexible substrate 100. The flexible organic light-emitting display apparatus may include a buffer layer 111 to reduce or effectively prevent impurities from penetrating a semiconductor layer of the thin film transistor TFT, a gate insulating film 112 for insulating the semiconductor layer of the thin film transistor TFT and the gate electrode from each other, an insulating interlayer 113 for respectively insulating source/drain electrodes of the thin film transistor TFT and the gate electrode from each other, a protection film 114 that covers the thin film transistor TFT, and other components. Although the protection film 114 is shown to have a flat top surface in FIG. 4, the invention is not limited thereto, and the protection film 114 may have a non-planar or bent top surface.

A red sub-pixel R, a green sub-pixel G and a blue sub-pixel B are disposed on the protection film 114. That is, a plurality of pixel electrodes 116R, 116G and 116B are disposed on the protection film 114. An edge of each of the pixel electrodes 116R, 116G and 116B may be covered (e.g., overlapped) by a pixel defining layer 115. Intermediate layers 117R, 117G and 117B each including an emission layer are disposed on the pixel electrodes 116R, 116G and 116B. A counter electrode 118 as one body is disposed in a display region of the flexible organic light-emitting display apparatus so as to correspond to the pixel electrodes 116R, 116G and 116B and the sub-pixels R, G and B. The emission layer included in each of the intermediate layers 117R, 117G and 117B may be disposed so as to correspond to each of the pixel electrodes 116R, 116G and 116B, and other layers of the intermediate layers 117R, 117G and 117B may be disposed as one body with respect to the plurality of pixel electrodes 116R, 116G, and 116B when needed.

Although the pixel electrodes 116R, 116G and 116B are shown to be located on the protection film 114 in FIG. 4, the invention is not limited thereto. In one exemplary embodiment, for example, the pixel defining layer 115 may be omitted, and the protection film 114 may be patterned so as to serve as a pixel defining layer. Where the protection film 114 serves as a pixel defining layer, the pixel electrodes 116R, 116G and 116B may be located on substantially the same plane and/or in a same layer as the thin film transistor TFT.

In the flexible organic light-emitting display apparatus, the heating electrode layer 220 substantially corresponds to the whole surface of the flexible substrate 100. Openings 220R, 220G and 220B that are respectively correspond to the plurality of pixel electrodes 116R, 116G, and 116B may be defined in the heating electrode layer 220. Here, the heating electrode layer 220 may be understood as corresponding to an entirety of the surface of the flexible substrate 100 but corresponding to a shape or pattern of the pixel defining layer 115. Based on such a configuration, the heating electrode layer 220 is not located on a path through which light emitted from the emission layer included in each of the intermediate layers 117R, 117G and 117B is extracted to the outside, and the light is smoothly emitted to the outside through the openings 220R, 220G and 220B, thereby allowing a high light extraction rate to the outside to be secured.

The bottom emission type flexible organic light-emitting display apparatus in which light emitted from the emission layer included in each of the intermediate layers 117R, 117G and 117B is extracted to the outside through the flexible substrate 100 is illustrated in FIG. 4 and has been described so far, but the invention is not limited thereto.

In an alternative exemplary embodiment, for example, in a top emission type flexible organic light-emitting display apparatus in which light emitted from the emission layer included in each of the intermediate layers 117R, 117G and 117B is extracted to the outside through the counter electrode 118, the first heating electrode layer 210 (see FIGS. 1 to 3) located opposite to the display layer 110 with respect to the flexible substrate 100. Openings similar to openings 220R, 220G, and 220B that are respectively correspond to the plurality of pixel electrodes 116R, 116G, and 116B in FIG. 4, may be defined in the first heating electrode layer 210. Here, the first heating electrode layer 210 may be understood as corresponding to substantially an entirety of the surface of the flexible substrate 100 but corresponding to a shape or pattern of the pixel defining layer 115. Based on such a configuration, the first heating electrode layer 210 is not located on a path through which light emitted from the emission layer included in each of the intermediate layers 117R, 117G and 117B is extracted to the outside through the counter electrode 118, and the light is smoothly emitted to the outside through the openings defined in the first heating electrode layer 210, thereby allowing a high light extraction rate to the outside to be secured.

On the other hand, even where a flexible display apparatus includes a different display device than the organic light-emitting device as the display device, a heating electrode layer may have a structure that is the same as or similar to that of the heating electrode layer 220 described above with reference to the organic light emitting display apparatus shown in FIG. 4. That is, openings may be defined in the heating electrode layer of the flexible display apparatus that correspond to substantially the whole surface of the flexible substrate 100 but also correspond to a pattern or arrangement of a plurality of pixels. Thus, the heating electrode layer is not located on a path in which light travels to the outside the display device, and the light is smoothly emitted to the outside of the display device through the openings, thereby allowing a high light extraction rate to the outside to be secured.

In an exemplary embodiment, when the first and second heating electrode layers 210 and 220 include a translucent material, the first and second heating electrode layers 210 and 220 may have a shape corresponding to a whole surface of the flexible substrate 100 without openings being defined therein.

Figure 5:
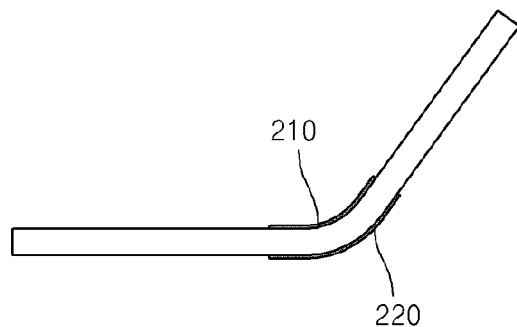
FIG. 5 is a schematic cross-sectional view of still another exemplary embodiment of a flexible display apparatus according to the invention.
Figure 6:
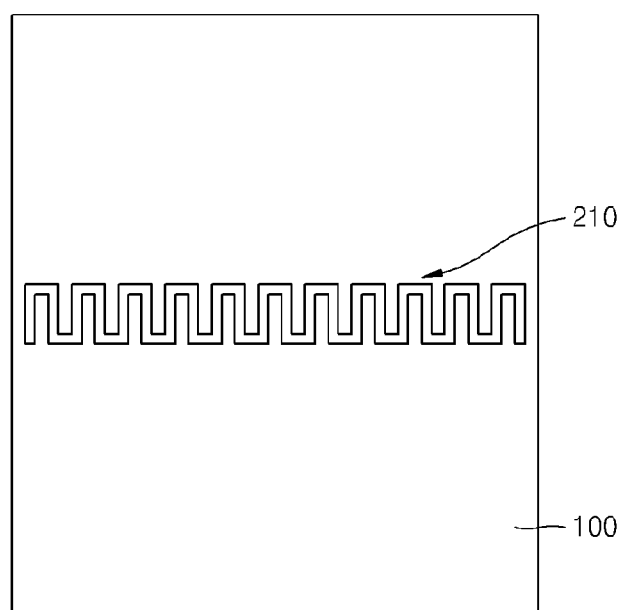
FIG. 6 is a schematic plan view of a part of the flexible display apparatus of FIG. 5.

FIG. 5 is a schematic cross-sectional view of still another exemplary embodiment of a flexible display apparatus according to the invention. FIG. 6 is a schematic plan view of a part of the flexible display apparatus of FIG. 5.

As illustrated in FIGS. 5 and 6, the flexible substrate 100 may be bent at a predetermined portion thereof. The first and/or second heating electrode layers 210 and 220 may correspond to the predetermined portion of the flexible substrate 100 at which the flexible substrate 100 is bent. That is, the first and second heating electrode layers 210 and 220 have a function to reduce or effectively prevent deterioration of a flexible characteristic of the flexible display apparatus when the flexible display apparatus is exposed to a low temperature environment. Thus, the first and/or second heating electrode layers 210 and 220 may correspond to only the predetermined portion of the flexible substrate 100 which is bent.

The first and second heating electrode layers 210 and 220 are shown to be located on opposing surfaces of the flexible substrate 100 in FIG. 5, for convenience of illustration. That is, as in the above-described exemplary embodiments of a flexible display apparatus according to the invention, the first and/or second heating electrode layers 210 and 220 may be interposed between various components of the flexible display apparatus.

Figure 7:
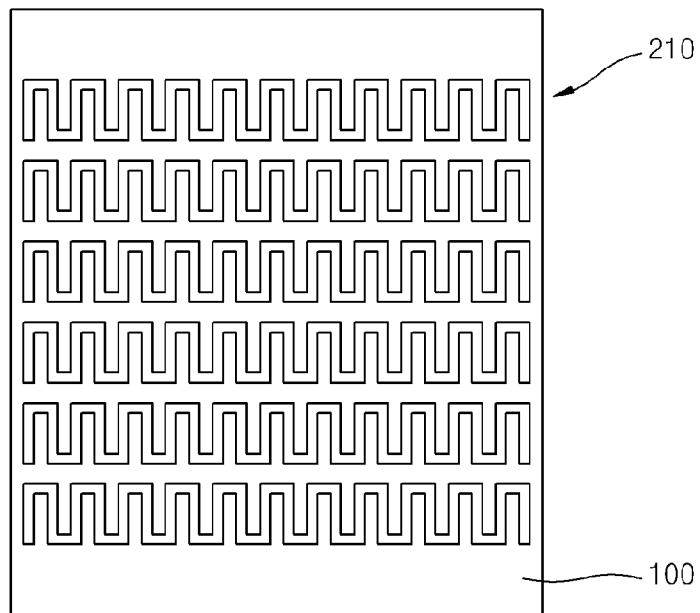
FIG. 7 is a schematic plan view of a part of yet another exemplary embodiment of a flexible display apparatus according to the invention.

As illustrated in FIG. 6, the first heating electrode layer 210 may include a heating electrode having a zigzag pattern in the plan view. The heating electrode having a zigzag pattern provides an increased flexible characteristic than a heating electrode having a cylindrical electrode shape. In this regard, as illustrated in FIG. 7 which is a schematic plan view illustrating a part of yet another exemplary embodiment of a flexible display apparatus according to the invention, even when the first heating electrode layer 210 corresponds to the majority of the whole surface of the flexible substrate 100, the heating electrode of the first heating electrode layer 210 may have a zigzag pattern.

Figure 8:
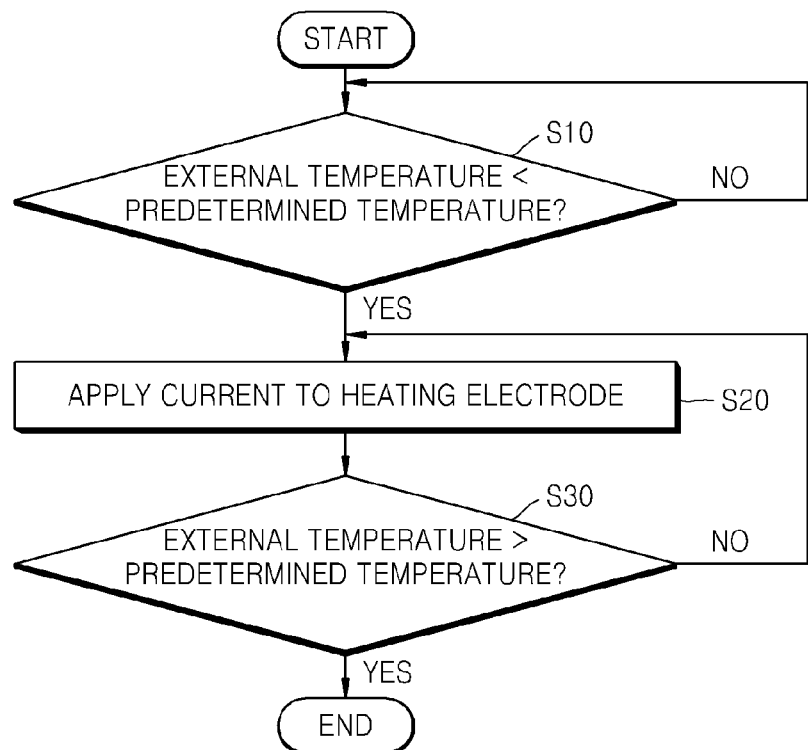
FIG. 8 is a schematic flow chart illustrating an exemplary embodiment of a method of controlling flexibility of a flexible display apparatus according to the invention.

FIG. 8 is a schematic flow chart illustrating an exemplary embodiment of a method of controlling flexibility of a flexible display apparatus according to the invention.

According to the method of controlling flexibility of a flexible display apparatus, an external temperature and a predetermined temperature are compared with each other (operation S10). Here, the external temperature may be sensed by a temperature sensing unit. The external temperature is a temperature outside of the flexible display apparatus and which is applied to the flexible display apparatus, such as from the surrounding environment.

As a result of the comparison, when the external temperature is lower than the predetermined temperature, an electrical current is applied to a heating electrode of a heating electrode layer (operation S20). Thus, even though the external temperature decreases, a flexible characteristic of the flexible display apparatus may not be decreased. When the external temperature is higher than the predetermined temperature, an operation of comparing the external temperature sensed by the temperature sensing unit with the predetermined temperature (operation S10) may be periodically repeated.

After the electrical current is applied to the heating electrode (operation S20), an operation of comparing the external temperature and the predetermined temperature with each other (operation S30) may be periodically repeated. In an exemplary embodiment, operation S30 may include an operation of comparing the external temperature and the predetermined temperature with each other while applying the current to the heating electrode of the heating electrode layer. When the external temperature is lower than the predetermined temperature even with the application of the electrical current, the operation of applying the current to the heating electrode (operation S20) may be repeatedly performed.

When the external temperature increases (while the electrical current is applied to the heating electrode of the heating electrode layer) and thus becomes higher than the predetermined temperature, the process of applying the current to the heating electrode is terminated. Once the application of the electrical current is terminated, the external temperature is continuously and/or periodically sensed by the temperature sensing unit, and the operation of comparing the external temperature and the predetermined temperature with each other (operation S10) may be again performed.

As described above, according to one or more exemplary embodiment of the invention, a flexible display apparatus of which a flexible characteristic is maintained under various environments, and a method of maintaining the flexibility of the flexible display apparatus may be realized.

While the invention has been particularly shown and described with reference to exemplary embodiments thereof, it will be understood by those of ordinary skill in the art that various changes in form and details may be made therein without departing from the spirit and scope of the invention as defined by the following claims.

What is claimed is:

1. A flexible display apparatus comprising:
   a flexible substrate;
   a display layer on the flexible substrate and comprising a plurality of pixels;
   a cover layer which covers the display layer;
   a heating electrode layer on a surface of the flexible substrate opposite to the display layer, between the flexible substrate and the display layer, between the display layer and the cover layer, or on a surface of the cover layer opposite to the display layer; and
   a predetermined temperature thereof at which a flexible characteristic of each of the flexible display substrate, the display layer, the cover layer and the heating electrode layer thereof is maintained,
   wherein the heating electrode layer generates heat which applies the predetermined temperature to the flexible display apparatus and maintains the flexible characteristic of each of the flexible display substrate, the display layer, the cover layer and the heating electrode layer.

2. The flexible display apparatus of claim 1, wherein the heating electrode layer generates the heat when a sensed external temperature is lower than the predetermined temperature.

3. The flexible display apparatus of claim 1, wherein the cover layer comprises a protection layer, a polarizing layer, a touch screen layer or a combination thereof.

4. The flexible display apparatus of claim 1, further comprising a functional layer between the display layer and the cover layer,
   wherein the heating electrode layer is between the functional layer and the cover layer.

5. The flexible display apparatus of claim 4, wherein the functional layer comprises a protection layer, a polarizing layer, a touch screen layer or a combination thereof.

6. The flexible display apparatus of claim 1, wherein the heating electrode layer corresponds to an entirety of the surface of the flexible substrate.

7. The flexible display apparatus of claim 1, wherein
   the flexible substrate is bendable at a predetermined portion thereof, and
   the heating electrode layer corresponds to the predetermined portion of the flexible substrate.

8. The flexible display apparatus of claim 1, wherein the display layer comprises:
   a plurality of pixel electrodes corresponding to the plurality of pixels,
   a pixel defining layer which overlaps the plurality of pixel electrodes and exposes a center portion of each of the plurality of pixel electrodes,
   a counter electrode corresponding to the plurality of pixel electrodes, and
   an intermediate layer between the plurality of pixel electrodes and the counter electrode, and comprising an emission layer.

9. The flexible display apparatus of claim 8, wherein
   the heating electrode layer corresponds to substantially an entirety of the surface of the flexible substrate, and
   openings corresponding to the plurality of pixel electrodes are defined in the heating electrode layer.

10. The flexible display apparatus of claim 8, wherein the heating electrode layer corresponds to substantially an entirety of the surface of the flexible substrate, and has a shape corresponding to the pixel defining layer in a plan view.

11. The flexible display apparatus of claim 1, wherein
    the heating electrode layer corresponds to substantially an entirety of the surface of the flexible substrate, and
    openings corresponding to the plurality of pixels are defined in the heating electrode layer.

12. The flexible display apparatus of claim 1, wherein the heating electrode layer corresponds to an entirety of the surface of the flexible substrate, and comprises a conductive translucent material.

13. The flexible display apparatus of claim 1, wherein the heating electrode layer comprises a heating electrode having a zigzag pattern.

14. The flexible display apparatus of claim 1, wherein the heating electrode layer is provided in plurality and includes first and second heating electrode layers respectively on opposing surfaces of the flexible substrate.

15. The flexible display apparatus of claim 14, wherein
    the flexible substrate is bendable at a predetermined portion thereof, and
    the first and second heating electrode layers each correspond to the predetermined portion of the flexible substrate.

* * * * *